United States Patent [19]

Sato et al.

[11] Patent Number: 4,906,919
[45] Date of Patent: Mar. 6, 1990

[54] MOVING MAGNET TYPE METER

[75] Inventors: Koichi Sato; Tetsuro Togawa; Toshiyuki Ohtake, all of Nagaoka, Japan

[73] Assignee: Nippon Seiki Co., Ltd., Niigata, Japan

[21] Appl. No.: 366,942

[22] Filed: Jun. 16, 1989

[30] Foreign Application Priority Data

Jun. 30, 1988 [JP] Japan .............................. 63-87096[U]
Jun. 30, 1988 [JP] Japan .............................. 63-87097[U]

[51] Int. Cl.$^4$ ................................................ G01R 1/20
[52] U.S. Cl. .................................. 324/154 R; 324/143
[58] Field of Search ............. 324/154 R, 154 PB, 143, 324/156, 146; 335/222; 336/231, 208, 198

[56] References Cited

U.S. PATENT DOCUMENTS

| 1,485,289 | 2/1924 | Peterson | 336/198 |
| 3,150,318 | 9/1964 | Friedmann | 324/156 |
| 4,646,803 | 3/1987 | Hanaoka et al. | 336/198 |
| 4,760,333 | 7/1988 | Ichimura et al. | 324/156 |

FOREIGN PATENT DOCUMENTS 19801  6/1988  Japan .

Primary Examiner—Reinhard J. Eisenzopf
Assistant Examiner—Maura K. Regan
Attorney, Agent, or Firm—Lowe, Price, LeBlanc, Becker & Shur

[57] ABSTRACT

In the moving magnet type meter of the present invention, the coil mounting portions of a bobbin body are projected outwards in a generally arched shape on the central side to form circular arc-like or inclined surfaces, whereby the bobbin body can be made strong against the external pressure induced by the mounting of coils thereon and can be prevented from being deformed. Further, the upper portion of a movable magnet is centrally formed with an upwardly projecting shaft support portion for supporting a pointer shaft, and a thrust bearing portion is formed in the lower surface of an upper bobbin body portion in an opposed relation to the upper end face of the said shaft support portion through a predetermined slight gap, whereby the pointer shaft can be formed in the shape of a straight rod without forming a reduced-diameter portion serving as a thrust bearing, so the fabrication of the pointer shaft is easy and it is possible to maintain the strength of the pointer shaft itself.

11 Claims, 5 Drawing Sheets

MOVING MAGNET TYPE METER

BACKGROUND OF THE INVENTION

1. Field of the Invention:

The present invention relates to a moving magnet type meter wherein a movable magnet is caused by perform an angular motion by virtue of a magnetic field generated in coils when energized, thereby operating the pointer.

2. Description of the Prior Art:

Moving magnet type meters are disclosed, for example, in U.S. Pat. No. 4,760,333 and Japanese Utility Model Publication No. 19801/1988. FIG. 5 shows an example of such conventional moving magnet type meter, in which a bobbin body 3 is constituted by upper and lower bobbins 1, 2 formed of a synthetic resin; a movable magnet 4 is disposed within the bobbin body 3; the upper end of a pointer shaft 5 inserted through the movable magnet 4 is projected from the upper bobbin 1, with a pointer 6 being fixed to the thus-projecting upper end of the pointer shaft; a plurality of leg portions 7 formed at the outer edge of the bobbin 3 projectingly in diagonal positions, the leg portions 7 being each provided with a terminal 8 connected electrically to the exterior such as a power source; leader lines of coils 9 wound crosswise round the bobbin body 3 are connected to the terminals 8; and the movable magnet 4 is caused to perform an angular motion by virtue of a combined magnetic field generated in response to electric currents flowing through the coils 9, thereby causing the pointer 6 to make indication.

In the above moving magnet type meter, the pointer shaft 5 and the movable magnet 4 disposed within the bobbin body 3 formed of a synthetic resin are supported in predetermined positions through bearings so as to be rotatable smoothly.

As such bearing structure, a lower bearing 10 which supports the lower end portion of the pointer shaft 5 in the radial direction is disposed nearly centrally of the lower bobbin 2, while an upper bearing 11 which supports the upper end side of the pointer shaft 5 in the radial and thrust directions is provided in the upper bobbin 1.

In this connection, a reduced-diameter portion 12 is formed at the upper end portion of the pointer shaft 5 and a thrust bearing portion 14 is formed by a stepped part 13 defined by the reduced-diameter portion 12 and the inner wall portion of the upper bobbin 1 through a slight gap, so a vertical clearance, namely, a thrust gap, for the pointer shaft 5 is set between the bearing portion of the lower bobbin 2 and the thrust bearing portion 14 of the upper bobbin 2, and outer peripheral portions 1' and 2' of the bobbin body 3 are formed flat. Therefore, due to a change in temperature during or after the mounting of the coils 9 or due to an external pressure load induced by the mounting of the coils, the outer peripheral portions 1' and 2' of the bobbin body 3 will be deflected inwards, resulting in that the movable components (movable magnet 4 and pointer shaft 5) disposed within the bobbin body 3 are displaced in thrust clearance and hence extinguished by the deflection of the bobbin body 3, so the bobbin body 3 side and the movable component side come into contact with each other, thus causing the movable components to become inoperative.

Moreover, the wound state of the coils may be changed by such deformation of the bobbin body 3, causing a change in the magnetic torque exerted on the movable magnet 4 and resultant deviation in the indication characteristic.

Further, in the above conventional structure, it is necessary to form the stepped part 13 at the upper end portion of the pointer shaft 5, for example by cutting, so much labor is required for the fabrication of such part; besides, since the pointer 6 is fixed to the reduced-diameter portion 12 by such means as press fitting, there is a tendency to deteriorated strength.

SUMMARY OF THE INVENTION

The present invention has been accomplished in view of the above circumstances and it is the first object thereof to provide a moving magnet type meter enhanced in the strength of a bobbin body and difficult to exert a bad influence on the operation of movable components.

It is the second object of the present invention to provide a moving magnet type meter capable of facilitating the fabrication of a pointer shaft which serves as a moving part of the meter and also capable of maintaining the pointer shaft at a sufficiently high strength.

DETAILED DESCRIPTION OF THE PREFERRED EMBODIMENTS

Figure 5:
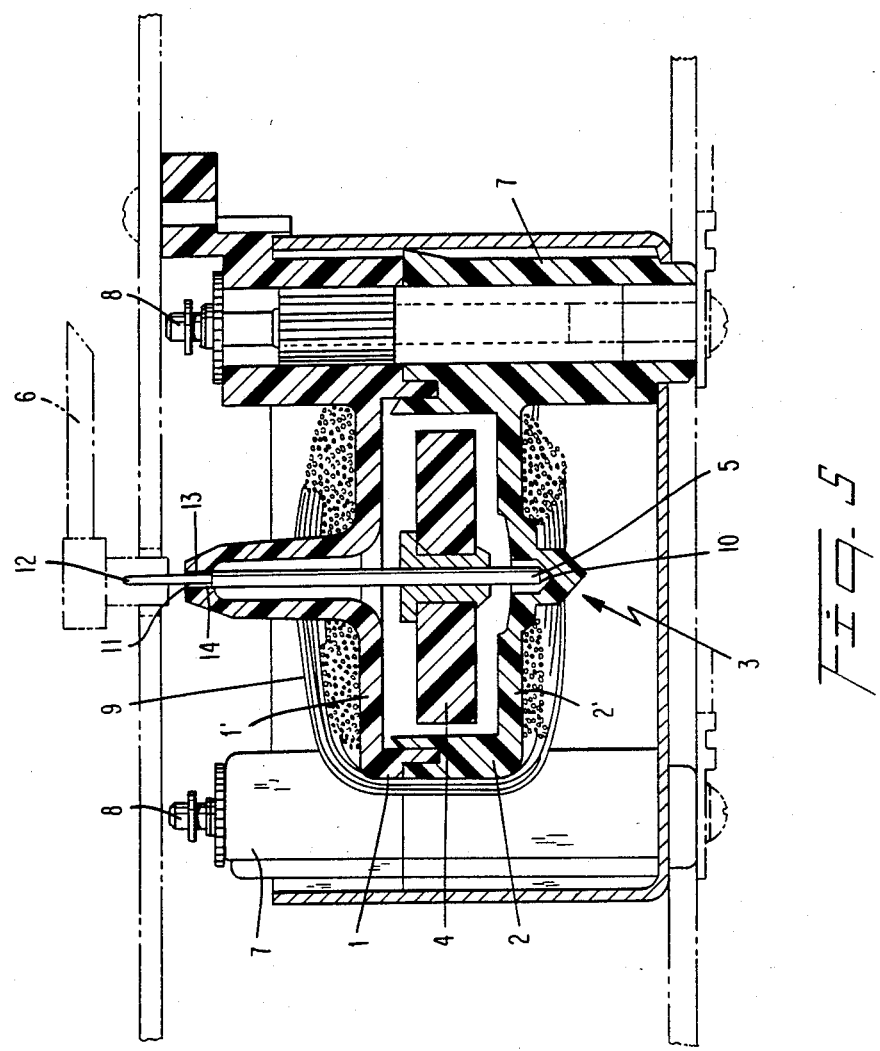
FIG. 5 is a sectional view of a conventional moving magnet type meter.

Embodiments of the present invention will be described hereinunder, using the same reference numerals for the portions which are the same as in FIG. 5.

Figure 1:
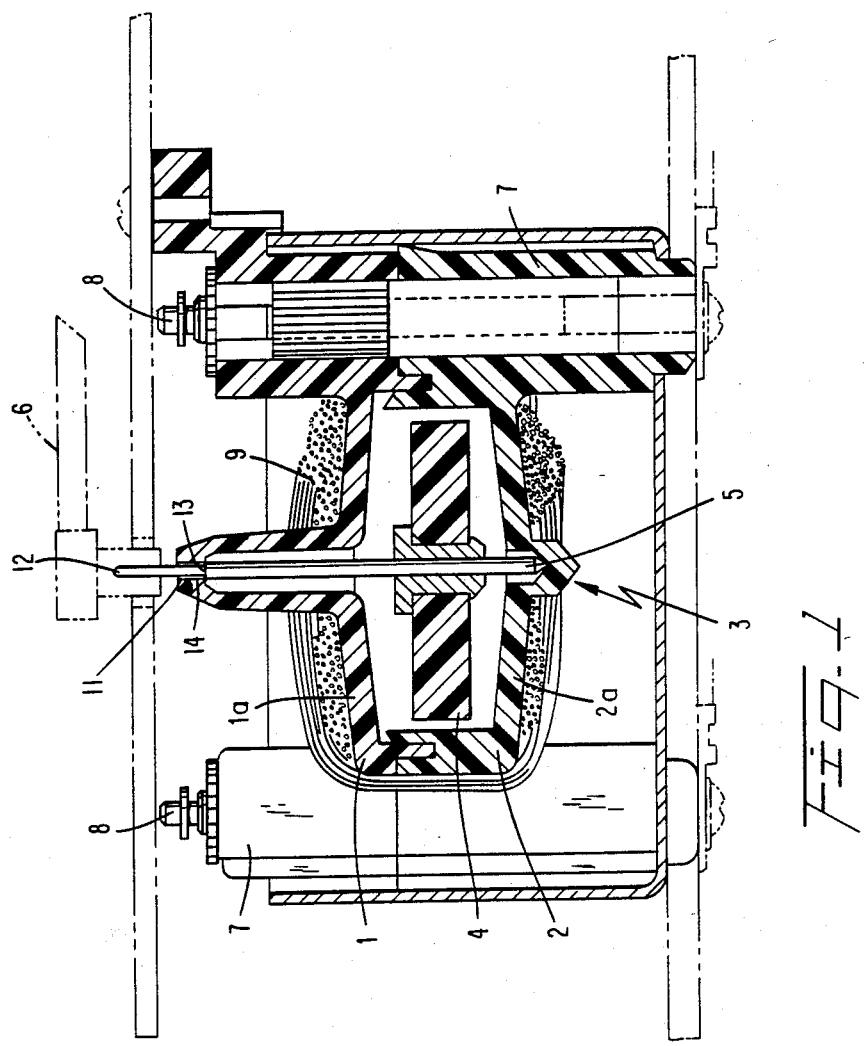
FIG. 1 is a sectional view of a moving magnet type meter according to a first embodiment of the present invention.

FIG. 1 illustrates a moving magnet type meter according to a first embodiment of the present invention, in which the numerals 4, 5 and 6 denote a movable magnet, a pointer shaft and a pointer, respectively; numeral 7 denotes a leg portion which is provided in a plural number; numerals 8, 9, 10 and 11 denote a terminal, a coil, a lower bearing and an upper bearing, respectively; numerals 12, 13 and 14 denote a reduced-diameter portion, a stepped part and a thrust bearing portion, respectively. These are almost the same in construction as the prior art shown in FIG. 5, but in this embodiment a bobbin body 3 comprising an upper bobbin 1 and a lower bobbin 2 is raised at the portions thereof through which the pointer shaft 5 extends, to form generally arched, inclined surfaces as coil mounting portions 1a and 2a.

In the moving magnet type meter of this embodiment thus constructed, when the coils 9 are mounted on the inclined coil mounting portions 1a and 2a of the bobbin body 3, a high strength is ensured against external pressures, permitting the prevention of deformation and hence permitting the elimination of the drawbacks involved in the conventional structure, whereby the first object of the invention can be achieved.

Figure 2:
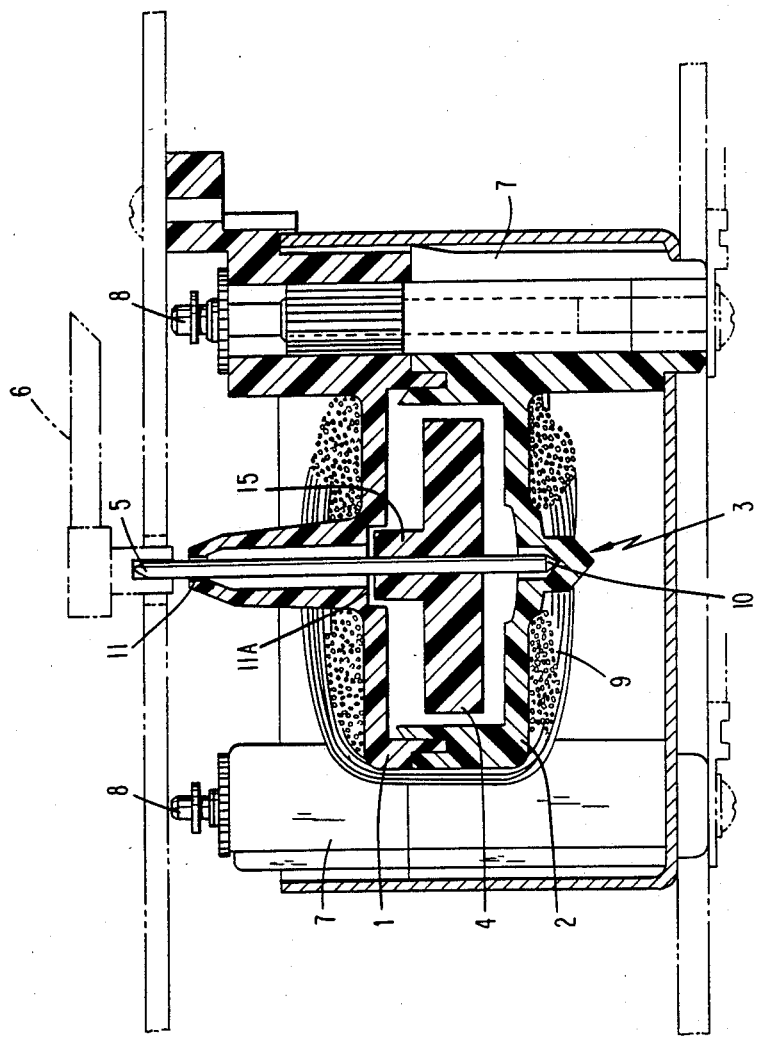
FIG. 2 is a sectional view of a moving magnet type meter according to a second embodiment of the present invention.

Referring now to FIG. 2, there is illustrated a moving magnet type meter according to a second embodiment of the present invention, in which the reference numerals 1 and 2 denote upper and lower bobbins, respectively, formed of a synthetic resin; numerals 3 and 6 denote a bobbin body and a pointer, respectively; numeral 7 denotes a leg portion which is provided in a plural number; numerals 8, 9 and 10 denote a terminal, a coil and a lower bearing, respectively. These are the same in construction as the prior art shown in FIG. 5 except the following points. In this embodiment, there is used a movable magnet 4 formed of a synthetic resin; the upper portion of the movable magnet 4 is formed with a generally cylindrical shaft support portion 15 integrally therewith around a pointer shaft 5; and a thrust bearing portion 11A constituted by a concave is formed in the inner wall of the upper bobbin 1 in an opposed relation to the upper end face of the shaft support portion 15 of the movable magnet 4 through a predetermined spacing. Further, the pointer shaft 5 is formed generally in a rod shape although the upper end thereof is slightly smaller in diameter. The lower end side of the pointer shaft 5 is supported radially by the lower bearing 10 formed centrally of the lower bobbin 2, and an upper bearing 11 is formed by the inner wall of the opening of the central cylindrical portion of the upper bobbin 1 to support the upper end side of the pointer shaft 5 radially. The pointer shaft 5 is set in its thrust dimension and supported between the thrust bearing portion 11A of the upper bobbin 1 and the lower bearing 10 of the lower bobbin.

Therefore, the pointer shaft 5 requires less post-machining, including cutting, and the production of the components is easy. In this embodiment, moreover, since the shaft support portion 15 is projectingly formed integrally with the movable magnet 4, the movable magnet 4 can be press-fitted and fixed onto the pointer shaft over a larger length, whereby the press-fitting strength can be enhanced and the upper thrust bearing portion can be formed without reducing the diameter of the upper end portion of the pointer shaft 5 on which the pointer 6 is to be press-fitted, thus making it possible to attain the second object of the present invention.

Figure 3:
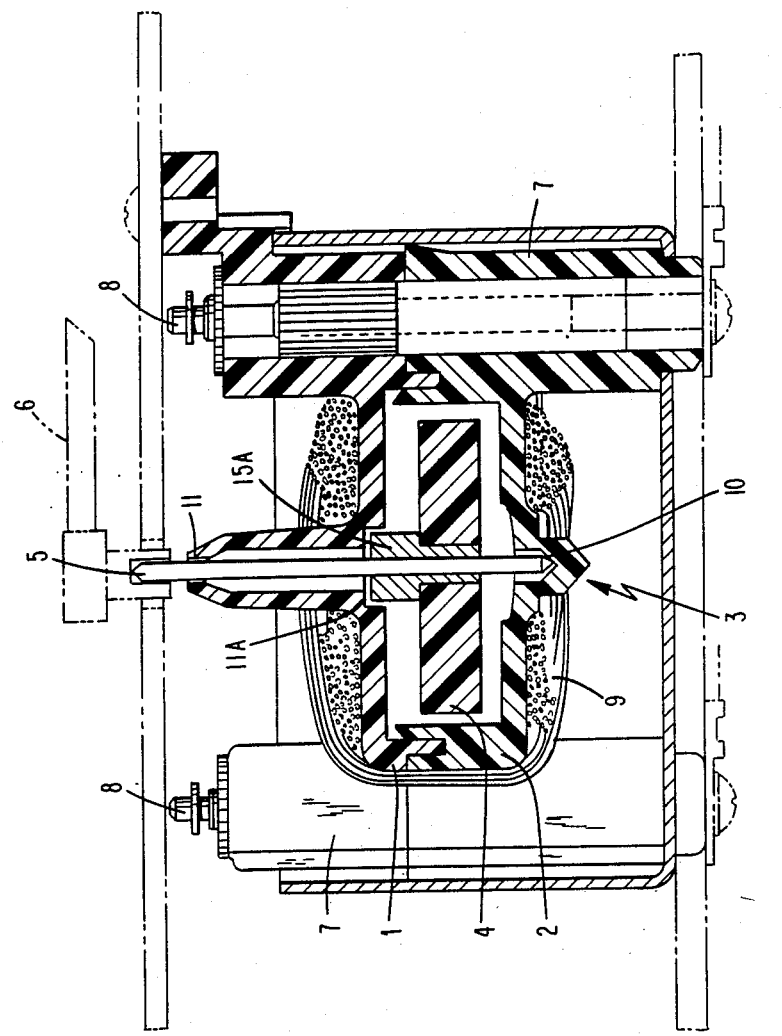
FIG. 3 is a sectional view of a moving magnet type meter according to a third embodiment of the present invention.

Referring now to FIG. 3, there is illustrated a movable magnet type meter according to a third embodiment of the present invention, which meter employs a ferrite magnet as a movable magnet 4. In this case, in order to compensate for the fragile property of the ferrite magnet, a metallic bushing 15A is fixed through the center of the ferrite magnet and is allowed to serve as a shaft support portion, then a pointer shaft 5 which is generally rod-like, not having such a reduced-diameter portion 12 as in the conventional structure, is press-fitted and fixed into the metallic bushing 15A.

The upper end of the metallic bushing 15A serving as the shaft support portion on which is fitted and fixed the movable magnet 4 extends upward from the upper surface of the movable magnet, and a thrust bearing portion 11A constituted by a concave is formed in the inner wall of an upper bobbin 1 in an opposed relation to the upper end face of the thus-extending metallic bushing 15A through a predetermined spacing.

Therefore, the lower end side of the pointer shaft 5 is supported radially by a lower bearing 10 formed at the central part of a lower bobbin 2, while an upper bearing 11 is formed by the inner wall of the opening of a central cylindrical portion of the upper bobbin 1, whereby the upper end side of the pointer shaft 5 is supported radially.

Further, the position of the upper end face of the metallic bushing 15A is restricted by the thrust bearing portion 11A of the upper bobbin 1 and that of the lower end of the pointer shaft 5 restricted by the lower bearing 10 of the lower bobbin 2, whereby the pointer shaft 5 is positioned and supported in the thrust direction within the bobbin body 3.

In the moving magnet type meter of this embodiment, by thus fixing the metallic bushing 15 to the ferrite magnet, it becomes easier to mount the movable magnet 4 onto the pointer shaft 5; besides, it is easy to effect machining of the pointer shaft 5 and the strength of the portion where the pointer shaft 5 is press-fitted becomes higher than in the prior art, resulting in that the second object of the present invention can be achieved.

Figure 4:
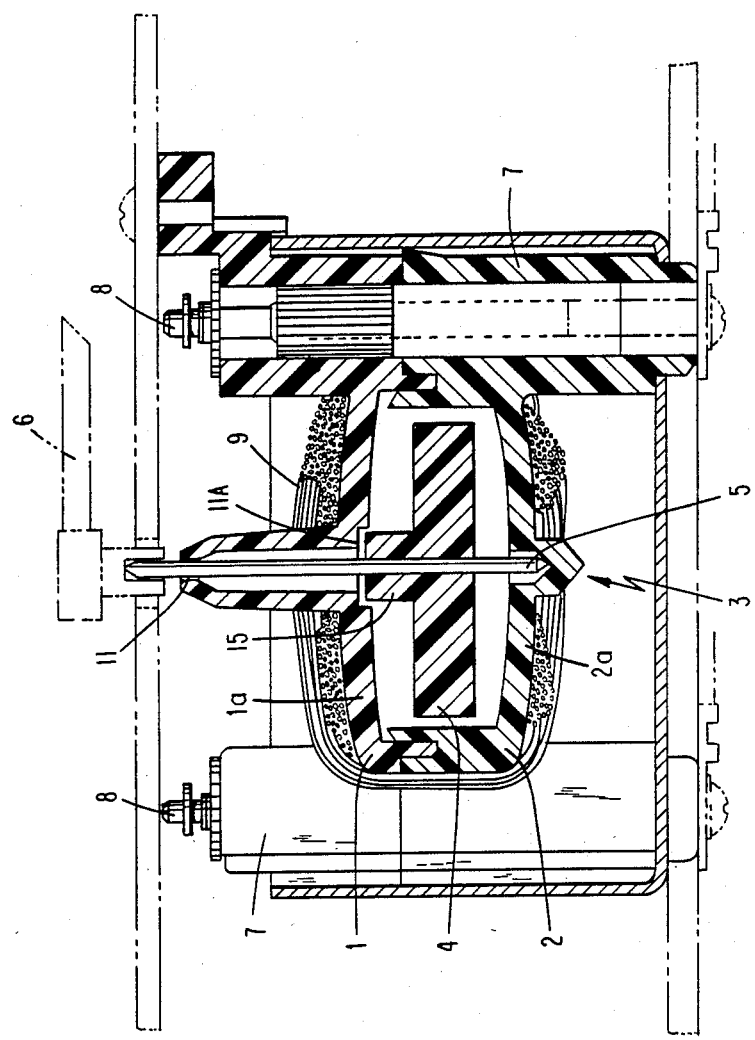
FIG. 4 is a sectional view of a moving magnet type meter according to a fourth embodiment of the present invention.

Referring now to FIG. 4, there is illustrated a moving magnet type meter according to a fourth embodiment of the present invention, in which the numeral 6 denotes a pointer; numeral 7 denotes a leg portion which is provided in a plural number; numerals 8, 9 and 10 denote a terminal, a coil and a lower bearing, respectively. These are about the same in construction as the prior art shown in FIG. 5. In this embodiment, the portions of a bobbin body 3 comprising upper and lower bobbins 1, 2 through which a pointer shaft 5 is to extend are raised outwards to form generally arched, circular arc-like surfaces as coil mounting portions 1a and 2a. Further, a synthetic resin magnet is used as a movable magnet 4, and the pointer shaft 5 is formed generally rod-like without providing a stepped part. In this case, the upper portion of the movable magnet 4 which is press-fitted and fixed onto the pointer shaft 5, is formed with a generally cylindrical shaft support portion 15 integrally with the movable magnet 4. Opposedly to the upper end face of the shaft support portion 15 of the movable magnet 4 and through a predetermined spacing a thrust bearing portion 11A constituted by a concave is formed in the inner wall of the upper bobbin 1.

When the coils 9 are mounted on the inclined coil mounting portions 1a and 2a of the bobbin body 3, there can be ensured a high strength against external pressures and the prevention of deformation. Besides, the pointer shaft 5 requires less post-machining such as cutting and the production of the components is easy; further, by forming rod-like the upper end portion of the pointer shaft 5 on which is press-fitted the pointer 6, without reducing its diameter, it is possible to enhance the strength of the pointer shaft 5, whereby the foregoing first and second objects of the present invention can both be achieved.

What is claimed is:

1. In a moving magnet type meter wherein a bobbin body is constituted by an upper bobbin and a lower bobbin both formed of a synthetic resin; a pointer shaft is disposed within said bobbin body and supported by said upper and lower bobbins; a movable magnet is fixed onto said pointer shaft so that the upper end of the pointer shaft projects from the upper end side of said bobbin body; a pointer is attached fixedly to the upper end of said pointer shaft; and coils are mounted on the outer periphery of said bobbin body, allowing said movable magnet to perform an angular motion to operate the pointer by virtue of a magnetic field generated in the coils when energized, the improvement characterized in that the portions of said bobbin body on which the coils are to be mounted are formed in a generally arched shape.

2. A moving magnet type meter according to claim 1, wherein the portions of said bobbin body comprising the upper and lower bobbins through which said pointer shaft is to extend are raised outwards to form generally arched, inclined surfaces as coil mounting portions.

3. A moving magnet type meter according to claim 1, wherein the portions of said bobbin body comprising the upper and lower bobbins through which said pointer shaft is to extend are raised outwards to form generally arched, circular arc-like surfaces as coil mounting portions.

4. In a moving magnet type meter wherein a bobbin body is constituted by an upper bobbin and a lower bobbin both formed of a synthetic resin; a pointer shaft is disposed within said bobbin body and supported by said upper and lower bobbins; a movable magnet is fixed onto said pointer shaft so that the upper end of the pointer shaft projects from the upper end side of said bobbin body; a pointer is attached fixedly to the upper end of said pointer shaft; and coils are mounted on the outer periphery of said bobbin body, allowing said movable magnet to perform an angular motion to operate the pointer by virtue of a magnetic field generated in the coils when energized, the improvement characterized in that said movable magnet is centrally formed with an upwardly projecting shaft support portion for supporting said pointer shaft, and a thrust bearing portion is formed in the lower surface of said upper bobbin in an opposed relation to the upper end face of said shaft support portion through a predetermined slight gap.

5. A moving magnet type meter according to claim 4, wherein said movable magnet is formed of a synthetic resin and is centrally formed with said upwardly projecting shaft support portion for supporting said pointer shaft.

6. A moving magnet type meter according to claim 4, wherein said movable magnet is constituted by a ferrite magnet, and a metallic bushing constituted as a shaft support portion is fixed to the center of said ferrite magnet.

7. In a moving magnet type meter wherein a bobbin body is constituted by an upper bobbin and a lower bobbin both formed of a synthetic resin; a pointer shaft is disposed within said bobbin body and supported by said upper and lower bobbins; a movable magnet is fixed onto said pointer shaft so that the upper end of the pointer shaft projects from the upper end side of said bobbin body; a pointer is attached fixedly to the upper end of said pointer shaft; and coils are mounted on the outer periphery of said bobbin body, allowing said movable magnet to perform an angular motion to operate the pointer by virtue of a magnetic field generated in the coils when energized, the improvement characterized in that the portions of said bobbin body on which the coils are to be mounted are formed in a generally arched shape; said movable magnet is centrally formed with an upwardly projecting shaft support portion for supporting said pointer shaft; and a thrust bearing portion is formed in the lower surface of said upper bobbin in an opposed relation to the upper end face of said shaft support portion through a predetermined slight gap.

8. A moving magnet type meter according to claim 3, wherein the portions of said bobbin body comprising the upper and lower bobbins through which said pointer shaft is to extend are raised outwards to form generally arched, inclined surfaces as coil mounting portions.

9. A moving magnet type meter according to claim 3, wherein the portions of said bobbin body comprising the upper and lower bobbins through which said pointer shaft is to extend are raised outwards to form generally arched, circular arc-like surfaces as coil mounting portions.

10. A moving magnet type meter according to claim 3, wherein said movable magnet is formed of a synthetic resin and is centrally formed with said upwardly projecting shaft support portion for supporting said pointer shaft.

11. A moving magnet type meter according to claim 3, wherein said movable magnet is constituted by a ferrite magnet, and a metallic bushing constituted as a shaft support portion is fixed to the center of said ferrite magnet.

* * * * *